(12) United States Patent
Baek et al.

(10) Patent No.: US 9,774,080 B2
(45) Date of Patent: Sep. 26, 2017

(54) ELECTROMAGNETIC WAVE SHIELDING SHEET FOR ANTENNA, METHOD FOR MANUFACTURING SAME, ANTENNA COMPRISING SAME, AND BATTERY PACK FOR PORTABLE TERMINAL HAVING SAID ANTENNA

(71) Applicant: Amotech Co., Ltd., Incheon (KR)

(72) Inventors: Hyung-Il Baek, Seoul (KR);
Joo-Seung Maeng, Incheon (KR);
Seung-Chul Lee, Incheon (KR);
Beom-Jin Kim, Gyeonggi-do (KR)

(73) Assignee: AMOTECH CO., LTD., Incheon (KR)

( * ) Notice: Subject to any disclaimer, the term of this patent is extended or adjusted under 35 U.S.C. 154(b) by 212 days.

(21) Appl. No.: 14/435,420

(22) PCT Filed: Oct. 11, 2013

(86) PCT No.: PCT/KR2013/009085
§ 371 (c)(1),
(2) Date: Apr. 13, 2015

(87) PCT Pub. No.: WO2014/058260
PCT Pub. Date: Apr. 17, 2014

(65) Prior Publication Data
US 2016/0028154 A1    Jan. 28, 2016

(30) Foreign Application Priority Data

Oct. 11, 2012  (KR) .................... 10-2012-0112999
Oct. 10, 2013  (KR) .................... 10-2013-0120807

(51) Int. Cl.
*H01Q 1/00*   (2006.01)
*H01Q 1/52*   (2006.01)
(Continued)

(52) U.S. Cl.
CPC ......... *H01Q 1/526* (2013.01); *C23C 14/185* (2013.01); *C23C 16/44* (2013.01); *C25D 3/38* (2013.01);
(Continued)

(58) Field of Classification Search
USPC ................. 343/787, 788, 720, 841
See application file for complete search history.

(56) References Cited

U.S. PATENT DOCUMENTS 7,088,304 B2 *  8/2006  Endo .................. G06K 19/0726
                                                       343/788
2006/0154465 A1 *  7/2006  Suh .................... H01L 21/76846
                                                       438/597

(Continued)

FOREIGN PATENT DOCUMENTS

JP    2008310572    12/2008
KR    101163574     7/2012
(Continued)

*Primary Examiner* — Jessica Han
*Assistant Examiner* — Hai Tran
(74) *Attorney, Agent, or Firm* — Wells St. John P.S.

(57) ABSTRACT

The present invention relates to an electromagnetic wave shielding sheet for an antenna, to a method for manufacturing same, to an antenna comprising same, and to a battery pack for a portable terminal having said antenna. The method for manufacturing the electromagnetic wave shielding sheet for the antenna may reduce a frequency variation, provide a heat-dissipating function, and prevent peel-off. The method comprises: a step of preparing a ferrite sheet; and step of placing a heat-dissipating layer on one side of the ferrite sheet. The present invention has advantages in that the adhesive forces of the ferrite sheet and the heat-dissipating layer are excellent and the heat-dissipating effects are excellent, the electromagnetic wave shielding sheet can be applied to various antenna products, and the frequency variation can be reduced when the antenna having the (Continued)

electromagnetic wave shielding sheet is mounted on the battery pack.

14 Claims, 11 Drawing Sheets

(51) Int. Cl.
    *C25D 3/38*      (2006.01)
    *C25D 3/44*      (2006.01)
    *C25D 3/46*      (2006.01)
    *C25D 3/48*      (2006.01)
    *C25D 7/06*      (2006.01)
    *C23C 16/44*      (2006.01)
    *C25D 7/00*      (2006.01)
    *C23C 14/18*      (2006.01)

(52) U.S. Cl.
    CPC ................ *C25D 3/44* (2013.01); *C25D 3/46* (2013.01); *C25D 3/48* (2013.01); *C25D 7/00* (2013.01); *C25D 7/0614* (2013.01)

(56) References Cited

U.S. PATENT DOCUMENTS

| 2009/0117328 A1* | 5/2009 | Kawai ................... B32B 18/00 |
| | | 428/141 |
| 2009/0146898 A1* | 6/2009 | Akiho ..................... H01Q 7/06 |
| | | 343/787 |
| 2012/0218068 A1 | 8/2012 | Yamakawa et al. |
| 2013/0126622 A1* | 5/2013 | Finn ................. G06K 19/07771 |
| | | 235/492 |

FOREIGN PATENT DOCUMENTS

| KR | 101175976 | 8/2012 |
| KR | 1020120007089 | 8/2012 |
| KR | 101189058 | 10/2012 |

* cited by examiner

FREQUENCY DISPERTION OF CU_SUBSTRATE-NFC
ANTENNA APPLIED TO BATTERY PACK

FIG. 10

| TEST CONDITION | DISTANCE (mm) | | | | Vpp(mV) | | | | | | | | |
|---|---|---|---|---|---|---|---|---|---|---|---|---|---|
| | CARD MODE (mm) | READER_MODE (mm) | | | EMV 2.0.1 LOAD MODULATION (mV) | | | | | | | | |
| | | | | | TAPE A | | | | TAPE B | | | | |
| TEST SET | ViVOpay 5000 | MIFARE CLASSIC 1K | MIFARE CLASSIC 4K | DESFIRE EV1 | 0,0 | 1,0 | 2,0 | 3,0 | 0,0 | 1,0 | 2,0 | 3,0 | |
| | | | | | 8.8mV | 7.2mV | 5.6mV | 4.0mV | 8.8mV | 7.2mV | 5.6mV | 4.0mV | |
| FERRITE ONLY | 43 | 42 | 44 | 22 | 75.27 | 37.71 | 14.42 | 5.64 | 64.32 | 33.34 | 14.21 | 5.35 | |
| Cu sub. (1.0um) | 41 | 38 | 43 | 20 | 52.48 | 28.03 | 11.58 | 5.13 | 52.22 | 27.92 | 11.08 | 5.25 | |

US 9,774,080 B2

ELECTROMAGNETIC WAVE SHIELDING SHEET FOR ANTENNA, METHOD FOR MANUFACTURING SAME, ANTENNA COMPRISING SAME, AND BATTERY PACK FOR PORTABLE TERMINAL HAVING SAID ANTENNA

CROSS REFERENCE TO RELATED APPLICATION

This is a 35 U.S.C. §371 application of, and claims priority to, International Application No, PCT/KR2013/009085, which was filed on Oct. 11, 2013, claiming priority to KR 10-2013-0120807 which was filed on Oct. 10, 2013, and claiming priority to KR 10-2012-0112999, which was filed on Oct. 11, 2012, and all the disclosures are incorporated herein by this reference in their entirety.

TECHNICAL FIELD

The present invention relates to an electromagnetic wave shielding sheet for an antenna. More particularly, the present invention relates to an electromagnetic wave shielding sheet for an antenna that is functionalized to shield electromagnetic waves and dissipate heat, a method for manufacturing the same, an antenna comprising the same, and a battery pack for a portable terminal having the antenna.

BACKGROUND ART

NFC (Near Field Communication) is a set of short-range technologies enabling wireless communication between devices by touching them together or by bringing them into proximity. NFC operates within a radio frequency band of 13.56 MHz, and traces its roots back to the electronic tag RFID (Radio Frequency Identification).

Now, NFC finds applications in a broad spectrum of fields including payment, transmission of information about articles or goods in supermarkets or stores, travel information for tourists, traffic access control, locking systems, etc.

As the market of portable terminals such as smart phones is in explosive expansion, NFC has recently been used to impart the terminals with various functions including information exchange thereamong, payment, ticket reservation, information search, etc.

However, smart phones that have been advanced for high performance suffer from the disadvantage of heat generation from the device CPU.

To reduce heat generation in smart phones, as shown in FIG. 1, a graphite sheet 1 is attached to a battery cover 2 while being covered with a protective film 3.

Having the molecular structure depicted in FIG. 1d, the graphite sheet 1 is excellent in thermal conductivity in the horizontal direction and thus can effectively dissipate heat from a heat source. However, the graphite sheet 1 has very weak interlayer bonding strength due to its platy structure.

Accordingly, as illustrated in FIGS. 1c and 1d, the graphite sheet 1 is highly prone to peel off from the battery cover 2, thus resulting in poor product reliability.

To overcome this problem, as shown in FIGS. 2A-2C, a graphite sheet 1 is designed to be smaller in size than protective films 3 and 5 that are provided on the opposite surfaces of the graphite sheet 1, with attachment to each other along their edges via adhesive tapes 7 and 8. With this assemblage, the graphite sheet is applied to a battery cover (not shown). FIG. 2C is a cross section taken along A-A' of FIG. 2A.

When the battery cover has a small area, however, it may be difficult to provide the protective films with edges that adhere to each other. This case may lead to product defects.

With regard to a related art, reference may be made to Korean Patent No. 1189058 (issued on Oct. 2, 2012, titled "A method for manufacturing a sheet for NFC antenna").

DISCLOSURE

Technical Problem

It is an object of the present invention to provide an electromagnetic wave shielding sheet for an antenna, the sheet functioning to shield electromagnetic waves and to dissipate heat, being superior in reliability thanks to its being free from peeling off, and being applicable to various forms of antenna products, a method for manufacturing the same, an antenna comprising the same, and a battery pack for a portable terminal having the antenna.

It is another object of the present invention to provide an electromagnetic. wave shielding sheet for an antenna, which can prevent the NFC antenna mounted on a battery pack from increasing in frequency variation, thus reducing a defective fraction of the antenna, a method for manufacturing the same, an antenna comprising the same, and a battery pack for a portable terminal having the antenna.

Technical Solution

In order to accomplish above objects, an aspect of the present invention provides an electromagnetic wave shielding sheet comprising a ferrite sheet, and a heat dissipating layer attached to one side of the ferrite sheet.

In one exemplary embodiment of the present invention, the heat-dissipating layer may be a metal layer.

In another exemplary embodiment of the present invention, the metal layer may be made of at least one selected from among copper, silver, gold, and aluminum.

In another exemplary embodiment of the present invention, the heat-dissipating layer has a thickness of 10 μm or less.

In another exemplary embodiment of the present invention, the electromagnetic wave shielding sheet may further comprise an adhesive layer between the ferrite sheet and the heat-dissipating layer via which the heat-dissipating layer is attached to the ferrite sheet.

In another exemplary embodiment of the present invention, the adhesive layer may be an acryl-based adhesive.

In another exemplary embodiment of the present invention, the adhesive may contain Ag and Ni powders in an amount of 10~30 volume %, based on a total volume thereof, so that the adhesive can function as a thermal conductor.

In another exemplary embodiment of the present invention, the heat-dissipating layer may be formed on a substrate at one side thereof and may be attached to the ferrite sheet at an opposite side thereof via an adhesive, the substrate being applied to the antenna.

In another exemplary embodiment of the present invention, the substrate may be a PET film or a PI film.

Another aspect of the present invention provides a method for manufacturing an electromagnetic wave shielding sheet for an antenna comprises preparing a ferrite sheet, and bonding a heat-dissipating layer to one side of the ferrite sheet.

The bonding of the heat-dissipating layer to one side of the ferrite sheet may comprise forming an adhesive on one side of the ferrite sheet, and disposing the heat-dissipating layer on the adhesive.

Alternatively, the bonding of the heat-dissipating layer to one side of the ferrite sheet may comprise depositing a metal on one side of a substrate to form the heat-dissipating layer, applying an adhesive to the heat-dissipating layer, and bonding the heat-dissipating layer to the ferrite sheet via the adhesive to form a multilayer structure composed of the ferrite sheet, the adhesive, the heat-dissipating layer and the substrate in sequence.

In one exemplary embodiment of the present invention, the heat-dissipating layer may be formed by bonding a copper foil to one side of the ferrite sheet via an adhesive.

In one exemplary embodiment of the present invention, the heat-dissipating layer may be integrated into the ferrite sheet using a process selected from among vacuum deposition, chemical vapor deposition, and electroplating.

In one exemplary embodiment of the present invention, the heat-dissipating layer is positioned on one side of the ferrite sheet, with an NFC antenna pattern on the opposite side of the ferrite sheet.

A further aspect of the present invention provides an antenna comprising an antenna unit comprising an antenna substrate and an antenna pattern; and the electromagnetic wave shielding sheet, applied to the antenna unit, for performing electromagnetic shield and heat dissipation.

A still further aspect of the present invention provides a battery pack for a portable terminal, comprising a battery pack body; and the antenna embedded in the battery pack body.

Advantageous Effects

Formed by incorporating a heat-dissipating layer into a ferrite sheet, the electromagnetic wave shielding sheet of the present invention is of high product reliability due to high bonding strength between the ferrite sheet and the heat-dissipating layer, and can be applied to various forms of antenna products.

In addition, the heat-dissipating layer allows the NFC antenna mounted to a battery pack to reduce in frequency variation, thereby contributing to the performance stabilization of the NFC antenna.

The method of the present invention in Which the electromagnetic wave shielding sheet can be manufactured by forming a heat-dissipating layer in a tape form and attaching the heat-dissipating layer to a ferrite sheet is advantageous in terms of workability and mass production.

Further, the adhesive layer for use in binding the ferrite sheet to the heat dissipating layer may be designed to contain a thermally conductive metal powder and thus to dissipate heat.

DESCRIPTION OF DRAWINGS

FIG. 10 is a table in which measurements of samples prepared in Experiments 1 and 2 of Table 1 for NFC antenna performance are summarized.

DESCRIPTION OF THE REFERENCE NUMERALS IN THE DRAWINGS

| | |
|---|---|
| 1: Graphite sheet | 2: Battery cover |
| 3, 5: Protective film | 7, 8: Adhesive tape |
| 10: ferrite sheet | 20: Adhesive layer |
| 30: Adhesive layer | 40: Substrate |
| 50: heat-dissipating layer | 50a: Cu—Ti seed layer |

Best Mode

Below, a detailed description will be given of the present invention with reference to the accompanying drawings.

The electromagnetic wave shielding sheet for an antenna in accordance with the present invention comprises a ferrite sheet, and a heat-dissipating layer applied to one side of the ferrite sheet.

Serving as an electromagnetic wave absorber, the ferrite sheet is used to block the radiation from the CPU, batteries, etc. in, for example, smart phones. The ferrite sheet may be prepared by sintering a ferrite powder admixed with a binder.

Because it is highly hydrophilic, the ferrite sheet can strongly adhere to the heat-dissipating layer without additional surface treatment. However, plasma surface treatment may be conducted to impart the ferrite sheet with higher adhesion to the heat-dissipating layer.

The heat-dissipating layer may be a metal layer made of at least one selected from among copper, silver, gold, and aluminum. As its name implies, the heat-dissipating layer aims to dissipate heat from a heat source.

Figure 1:
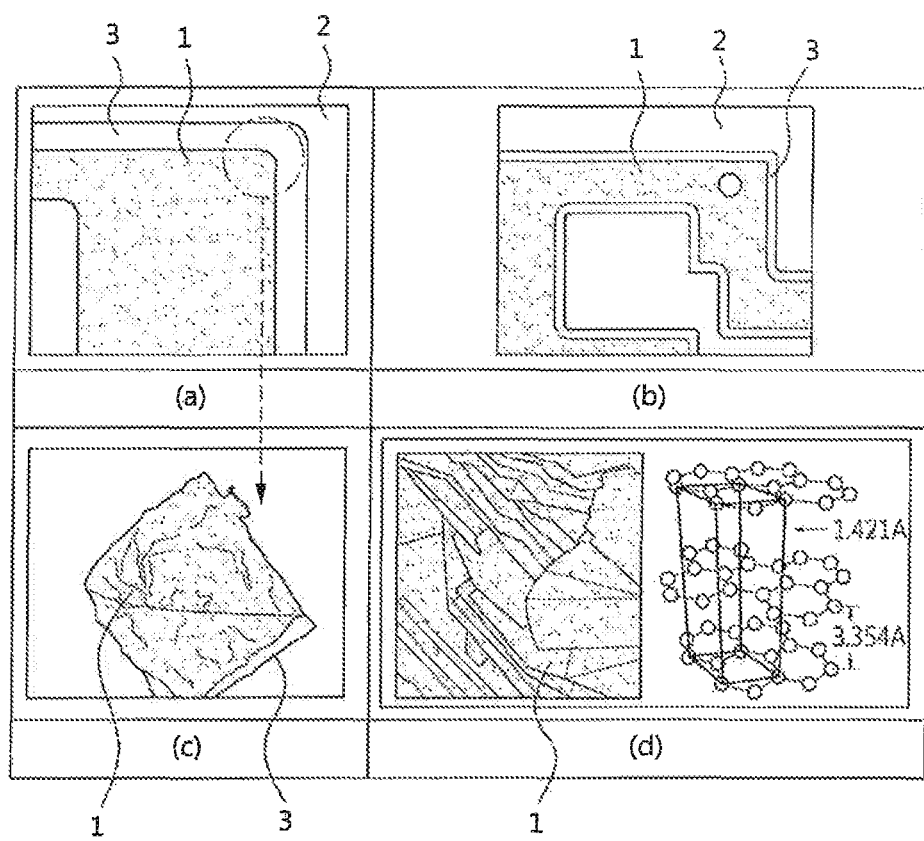
FIG. 1 shows views of a graphite sheet applied to a battery cover in a smart phone.
Figure 2A:
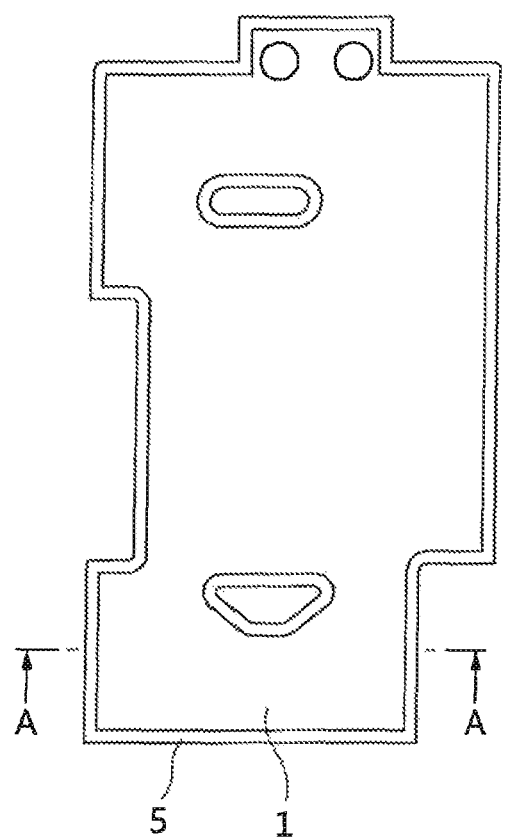
FIGS. 2A-2C show a graphite sheet covered with a larger protective film.
Figure 2B:
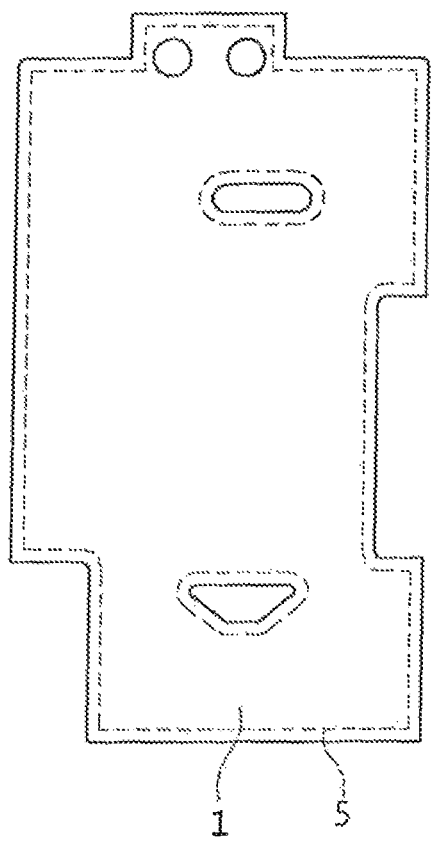
Figure 2C:
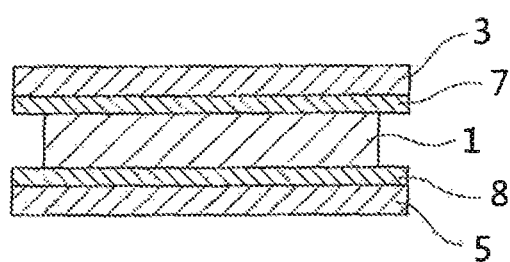
Figure 3:
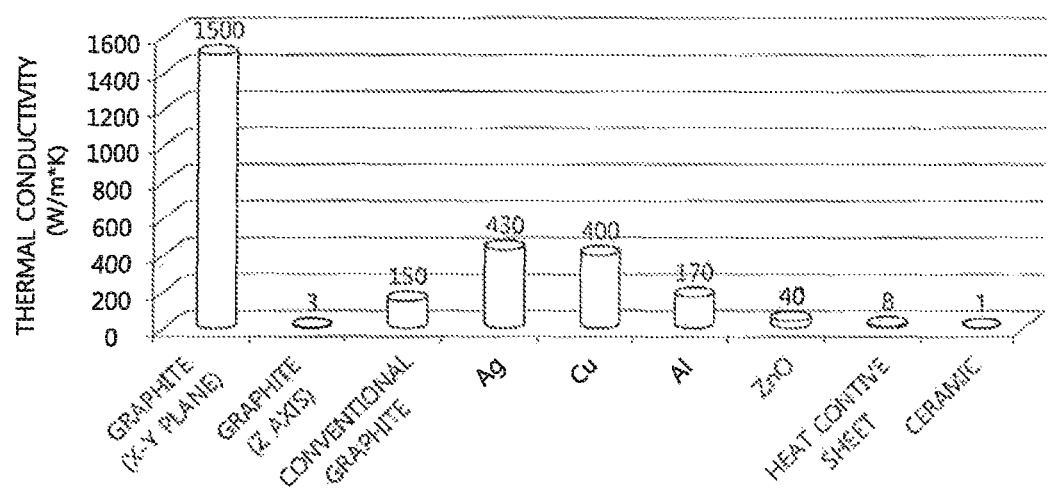
FIG. 3 is a graph showing thermal conductivity of graphite and metals.

As illustrated in FIG. 3, graphite is far superior in thermal conductivity to metal. Particularly, a graphite sheet exhibits excellent thermal conductivity in the plane direction (X-Y plane), but poor thermal conductivity in the thickness direction, so that it can play an important role as a heat-dissipating layer. However, as mentioned in the Background section, the graphite sheet is highly prone to peel off due to its poor interlayer bonding strength, which leads to degradation of product reliability.

In contrast, copper, silver, gold and aluminum, although lower in thermal conductivity than graphite, have relatively high thermal conductivity, compared to other metals. A metal sheet made of one or more of the metals may be used to perform heat dissipation as an alternative to a graphite sheet, which is highly apt to undergo a peel-off phenomenon when mounted to a battery cover because of its poor interlayer bonding strength.

The ferrite sheet with the heat-dissipating layer applied to one side thereof can satisfactorily perform the function of both electromagnetic wave absorption and heat dissipation.

The heat-dissipating layer has a thickness of 10 μm or less, and preferably a thickness of about 1 μm. This limitation is intended to minimize the thickness.

Since recent trends has been directed toward reducing the thinness of NFC antennas used in battery packs to 0.15 t or less and preferably 0.1 t or less, it is more important to control the frequency variation (dispersion) of NFC antennas. In response to the trends, the heat-dissipating layer is made thin so as not to increase the thickness of NFC antennas.

The electromagnetic wave shielding sheet of the present invention may further comprise an adhesive layer between the ferrite sheet and the heat-dissipating layer. Via the adhesive layer, the ferrite sheet and the heat-dissipating layer may be bonded to each other.

The adhesive layer may include an acryl-based adhesive. The acryl-based adhesive is curable at room temperature.

Based on the total volume of the adhesive, Ag and Ni powders may be contained in an amount of 10~30 volume %. Because they are conductive, Ag and Ni powders, when used in the adhesive, endow the adhesive layer with a thermal conductive function, thus enhancing the heat dissipation effect.

When a sum of Ag and Ni powders is below 10 volume %, the adhesive layer does not perform a conductive function. On the other hand, if the amount of Ag and Ni powders exceeds 30 volume %, the adhesive property of the adhesive layer may degrade.

In addition, the adhesive layer may further comprise a binder, an additive, and a curing agent, which may be used in the adhesive layer to increase the adhesive strength of the adhesive. The binder may be an epoxy. Within the scope of the additive, a diluent or a dispersant may fall.

The heat-dissipating layer may be formed on a substrate and bonded to a ferrite sheet via an adhesive. The substrate may be a PET film or a PI film.

The heat-dissipating layer is positioned on one side of the ferrite sheet, with an NFC antenna pattern on the opposite side of the ferrite sheet.

Below, a method for manufacturing the electromagnetic wave shielding sheet for an antenna in accordance with the present invention will be explained in embodiments.

When used in an NFC antenna mounted to a battery pack, the electromagnetic wave shielding sheet for an antenna, manufactured by the method of the present invention, can reduce a frequency variation, exhibit the function of heat dissipation, and prevent peel-off.

[Embodiment 1]

In one embodiment, a method for manufacturing an electromagnetic wave shielding sheet for an antenna comprises preparing a ferrite sheet, and forming a heat-dissipating layer on one side of the ferrite sheet.

The heat-dissipating layer may be made of at least one selected from among copper, silver, gold, and aluminum, and may be formed on one side of the ferrite sheet by vacuum evaporation, chemical vapor deposition, or electroplating.

When vacuum deposition is used, a layer of metal is deposited on the ferrite sheet by thermal evaporation in a vacuum. As for chemical vapor deposition, the ferrite sheet heated to a high temperature is exposed to a vaporized metal compound so that a metal layer is deposited on the ferrite sheet. For electroplating, metal is plated on the ferrite sheet immersed in a metal plating solution in the presence of an electric field.

Thus, an electromagnetic wave shielding sheet in which a heat-dissipating layer is integrally formed onto one side of the ferrite sheet is obtained in this manner.

Figure 4:
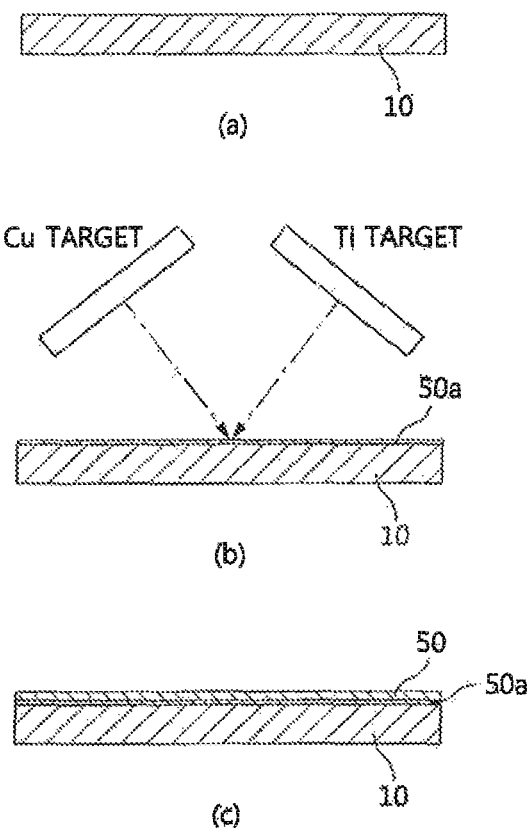
FIG. 4 illustrates a method for manufacturing an electromagnetic wave shielding sheet for an antenna in accordance with an embodiment of the present invention.

With reference to FIG. 4, there is a schematic view illustrating the formation of a copper heat-dissipating layer on one side of a ferrite sheet by vacuum deposition. A copper heat-dissipating layer with a high thickness can be formed using vacuum deposition.

As can be seen in FIG. 4, (a) a ferrite sheet 10 is prepared, (b) a Ti—Cu seed layer 50a is deposited on one side of the ferrite sheet 10, and then (c) a heat-dissipating layer 50 is formed on the same side of the ferrite sheet by vacuum deposition.

Intercalated between the ferrite sheet 10 and the copper heat-dissipating layer 50, the Ti—Cu seed layer functions to increase bonding strength between the ferrite sheet 10 and the copper heat-dissipating layer 50. The seed layer may be deposited using a sputtering process.

The Ti—Cu seed layer is formed by vaporizing Cu and Ti from solid targets with heat or electron beams and depositing the vaporized Cu and Ti on one side of the ferrite sheet 10. In a sputtering process, Cu and Ti are ejected from their respective solid target materials due to bombardment of the targets by heat or electron beams, and deposited on one side of the ferrite sheet 10 to form the Ti—Cu seed layer.

Preferably, the Ti—Cu seed layer is approximately 0.5 μm thick while the copper heat-dissipating layer has a thickness of 10 μm or less.

This deposition results in the integration of the heat-dissipating layer 50 into the ferrite sheet 10, thus requiring no adhesive for the attachment between the ferrite sheet 10 and the heat-dissipating layer 50.

Accordingly, antenna products, although versatile in design patterns, can be manufactured in a single banking process.

In addition, the absence of adhesives necessary for bonding the heat-dissipating layer 50 to the ferrite sheet 10 as a result of this process could allow the heat-dissipating layer to be 10 μm or thicker without significantly increasing the total thickness of the NFC antenna. Since an adhesive layer generally ranges in thickness from 10 to 20 μm, the thickness of the heat-dissipating layer 50 can be increased as much as the thickness of the adhesive excluded.

However, in consideration of the recent tendency toward the thinness of NFC antennas, the heat-dissipating layer is preferably made approximately 1 μm in thickness.

[Embodiment 2]

Figure 5:
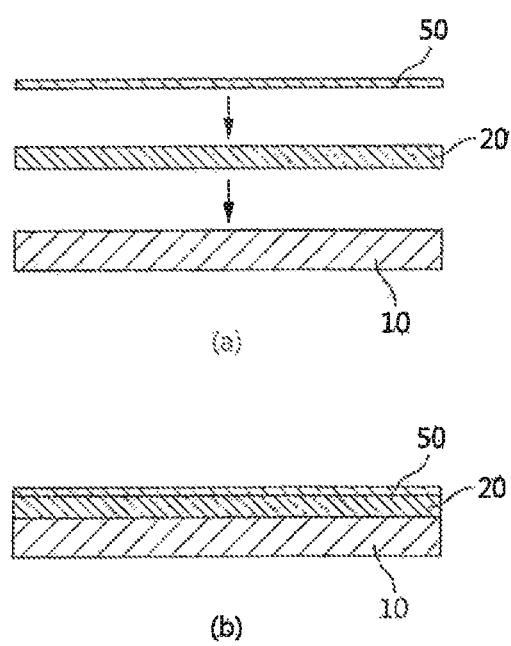
FIG. 5 illustrates a method for manufacturing an electromagnetic wave shielding sheet for an antenna in accordance with another embodiment of the present invention.

In this embodiment, a method for manufacturing an electromagnetic wave shielding sheet for an antenna comprises, as shown in FIG. 5, preparing a ferrite sheet 10, and bonding a heat-dissipating layer 50 to one side of the ferrite sheet 10 via an adhesive layer 20.

The heat-dissipating layer 50 may be made of a metal, like a copper foil, and may be formed by bonding, for example, a metal foil to one side of the ferrite sheet 10. In this regard, the adhesive layer 20 may be provided on one side of the ferrite sheet 10 or the copper foil.

For example, the adhesive layer 20 is formed on one side of the ferrite sheet 10, and then the copper foil is layered over the adhesive layer 20 to achieve attachment between the ferrite sheet 10 and the copper foil. Alternatively, the adhesive layer 20 is formed on one side of the copper foil, and then one side of the ferrite sheet 10 is brought into contact with the adhesive layer to achieve attachment between the ferrite sheet 10 and the copper foil.

The adhesive layer 20 may include an acryl-based adhesive. The acryl-based adhesive is curable at room temperature.

Based on the total volume of the adhesive, Ag and Ni powders may be contained in an amount of 10~30 volume %. Because they are conductive, Ag and Ni powders, when used in the adhesive, endow the adhesive layer with a thermal conductive function, thus enhancing the heat dissipation effect.

When a sum of Ag and Ni powders is below 10 volume %, the adhesive layer does not perform a conductive function. On the other hand, if the amount of Ag and Ni powders exceeds 30 volume %, the adhesive property of the adhesive layer may degrade.

In addition, the adhesive layer may further comprise a binder, an additive, and a curing agent, which may be used in the adhesive layer to increase the adhesive strength of the adhesive. The binder may be an epoxy. Within the scope of the additive, a diluent or a dispersant may fall.

The heat-dissipating layer constructed by bonding the copper foil to the ferrite sheet has a thickness of approximately 1 μm.

When the heat-dissipating layer 50 is formed on the ferrite sheet 10 in such a manner, the adhesive layer 20 can also be thermally conductive, further contributing to heat dissipation.

In an alternative embodiment, the heat-dissipating layer 50 attached to the ferrite sheet 10 may be incorporated with a different heat-dissipating layer or another heat-dissipating layer. For example, an adhesive layer is formed on opposite sides of a copper foil that is bonded with a ferrite sheet at one side and with another copper foil or a different heat-dissipating layer at the other side. In the event of using an additional heat-dissipating layer, the heat dissipation effect can be increased as much as the thickness increment of the heat-dissipating layer.

The heat-dissipating layer 50 may be a foil made of silver, gold or aluminum, instead of a copper foil.

Like copper, silver, gold and aluminum can be easily formed into a foil that is effective for heat dissipation and frequency stabilization.

[Embodiment 3]

Figure 6:
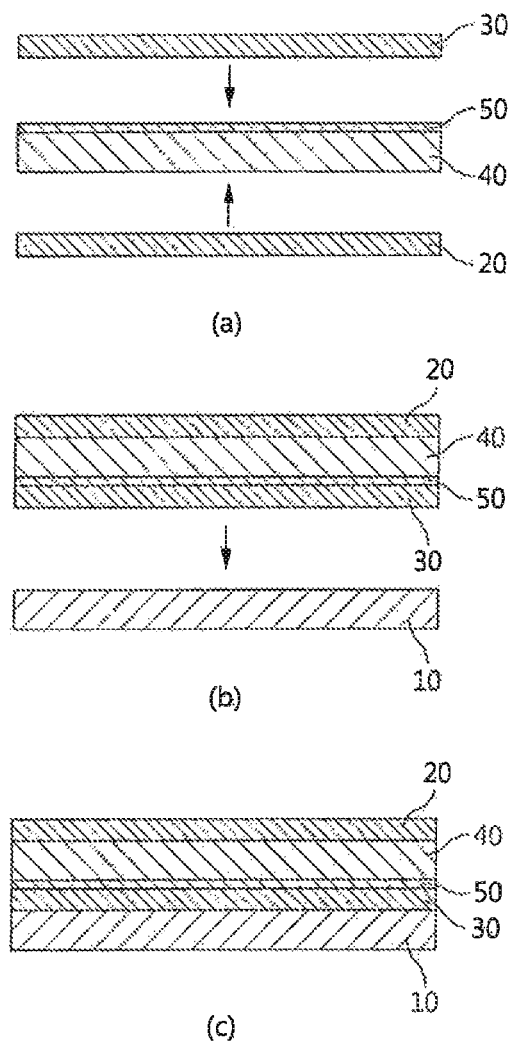
FIG. 6 illustrates a method for manufacturing an electromagnetic wave shielding sheet for an antenna in accordance with a further embodiment of the present invention.

According to this embodiment, as shown in FIG. 6, the method for manufacturing an electromagnetic wave shielding sheet for an antenna comprises preparing a ferrite sheet 10, and bonding a heat-dissipating layer 50 to one side of the ferrite sheet 10, the heat-dissipating layer 50 being formed by depositing a heat-dissipating metal on one side of a substrate 40.

A tape is constructed by applying an adhesive layer to one or both of the exposed sides of the substrate 40—heat-dissipating layer 50 structure, and bonding the dissipating layer 50 structure to one side of the ferrite sheet 10.

In detail, a heat-dissipating layer 50 is formed by depositing a metal on one side of a substrate 40, and one or both sides of the resulting structure are coated with an adhesive layer 20 and 30 to give a tape. This tape is applied to one side of the ferrite sheet 10 so that the heat-dissipating layer 50 is attached to one side of the ferrite sheet 10 via the adhesive layer 20.

Accordingly, the heat-dissipating layer 50 formed on the substrate 40 is bonded to the ferrite sheet 10 via an adhesive while the other side of the substrate 40 remains exposed for application to an antenna.

The substrate 40 may be a PET or PI film.

The heat-dissipating layer 50 is a metal layer made of at least one selected from among copper, silver, gold, and aluminum.

Copper, silver, gold and aluminum can be easily formed into a foil or deposited on a PET or PI film that is readily coated with an adhesive layer to give a single- or double-sided tape.

The heat-dissipating layer 50 constructed by depositing a metal on the substrate 40 has a thickness of approximately 1 μm.

The adhesive layer 20 and 30 may be an acryl-based adhesive. Preferably, the adhesive may contain Ag and Ni powders in an amount of 10~30 volume % based on the total volume thereof so as to function as thermal conductor, as well.

The method for manufacturing an electromagnetic wave shielding sheet for an antenna in accordance with this embodiment is advantageous in terms of workability and mass production because the heat-dissipating layer 50 is made in a tape form such that it is readily attached to the ferrite sheet 10.

The electromagnetic wave shielding sheet for an antenna manufactured by the method of the present invention may be temporarily fitted to an antenna substrate in which an NFC circuit pattern is formed, such as a polyester (PET) film or a polyimide (PI) film, and the resulting structure may be covered with a coverlay at its opposite sides, followed by hot pressing.

In this regard, the composite structure composed of the heat-dissipating layer 50 and the ferrite sheet 10 is temporarily fitted in such a way that the ferrite sheet 10 faces the PET or PI film at a position opposite to the NFC antenna pattern.

Hence, an antenna can be fabricated as a structure in which an antenna substrate, an antenna unit with an antenna pattern, a ferrite sheet, and a heat-dissipating layer of metal are stacked sequentially.

When applied to an NFC antenna, the electromagnetic wave shielding sheet according to the present invention can perform the double function of absorbing electromagnetic waves and dissipating heat from CPU or batteries of smart phones.

In addition, the heat-dissipating layer 50 reduces the frequency variation of the NFC antenna, thereby contributing to the stabilization of antenna performance.

The antenna mounted with the electromagnetic wave shielding sheet may be included and preferably embedded in a battery pack for portable terminals.

When mounted to a battery pack for portable terminals, the NFC antenna, although not shown, is attached to the battery pack body via the adhesive tape on the ferrite sheet. Generally, an NFC antenna is small in frequency variation When it exists as a separate article. When mounted to a battery pack, the NFC antenna may suffer from a large frequency variation due to various factors including loose attachment between the adhesive tape and the battery pack, adhesion strength, metal components of the battery pack, etc.

Thus, an NFC antenna may exhibit good quality as a separate article, but may be defective in NFC performance when mounted to a battery pack.

In the present invention, therefore, a heat-dissipating layer made of copper, gold, silver, and/or aluminum is formed on one side of the ferrite sheet, and allows the NFC antenna to decrease in frequency variation even when the NFC antenna is mounted to a battery pack.

Particularly, a copper heat-dissipating layer is effective for blocking the influence of the factors including loose attachment between the adhesive tape and the battery pack, adhesion strength, metal components of the battery pack, etc. on the NFC antenna, thus reducing the frequency variation of the NFC antenna.

In the following experiments, the NFC antenna mounted with the electromagnetic wave shielding sheet composed of the ferrite sheet and the copper heat-dissipating layer was measured for frequency variation.

Stack structures of NFC antennas applied to battery packs are given in Table 1, below.

Experiment 1 was conducted with a battery pack to which a ferrite sheet was attached via an adhesive tape while a copper heat-dissipating layer formed on one side of a ferrite sheet was attached via an adhesive tape to a battery pack for Experiment 2.

TABLE 1

| Stack Structure of NFC Antenna | Experiment 1 Ferrite Sheet (only) | Experiment 2 Ferrite Sheet + Cu Heat-Dissipating Layer |
|---|---|---|
| PSR INK | 5 | 5 |
| FPCB (antenna) | 35 | 35 |
| Adhesive tape-1 | 20 | 20 |
| Ferrite sheet | 60 | 61 (copper deposited 1 μm) |
| Adhesive tape-2 | 10 | 10 |
| Total thickness (μm) | 130 | 131 |

[PSR INK: photosolder resist ink]

As shown in Table 1, the NFC antenna to which the electromagnetic wave shielding sheet of the present invention is applied is 131 μm thick in total, and thus the thickness of the NFC antenna does not greatly increase even when a copper layer is formed on one side of the ferrite sheet.

Figure 7:
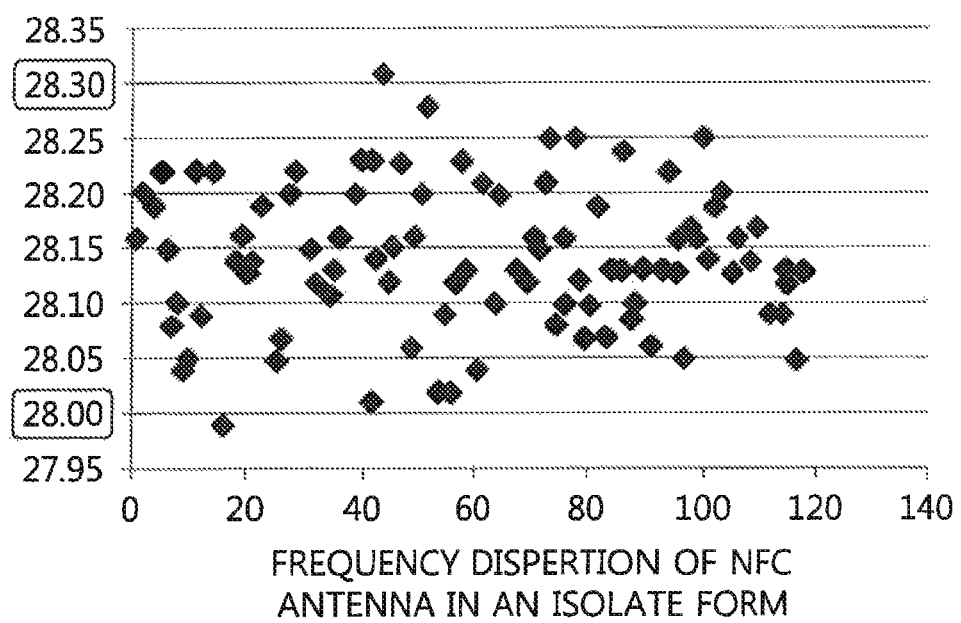
FIG. 7 is a graph showing the frequency dispersion of the Experiment 1 NFC antenna of Table 1 when it exists in an isolated form.
Figure 8:
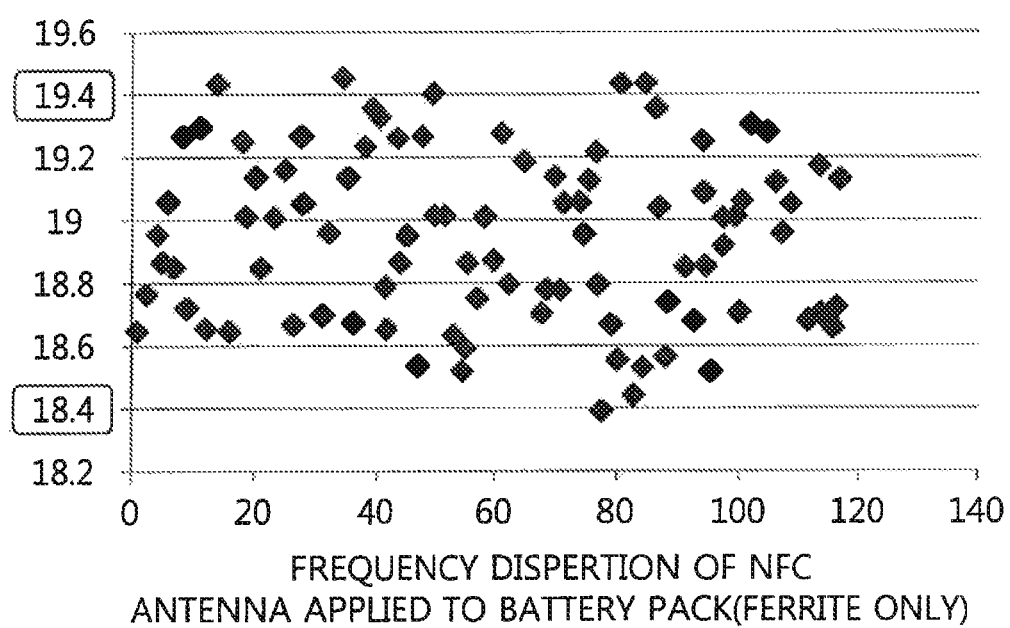
FIG. 8 is a graph showing the frequency' dispersion of the Experiment 1 NFC antenna of Table 1 when it is applied to a battery pack.
Figure 9:
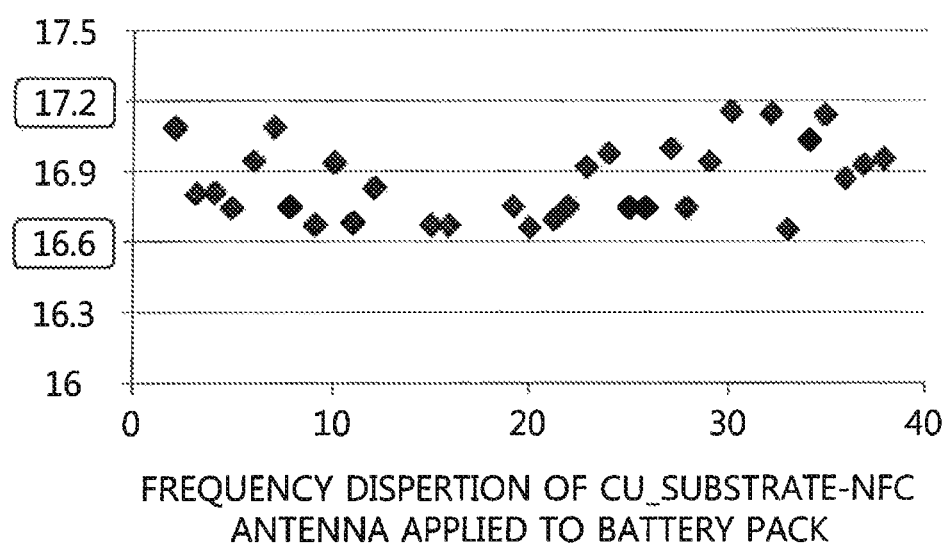
FIG. 9 is a graph showing the frequency dispersion of the Experiment 2 NFC antenna of Table 1 when it is applied to a battery pack.

FIG. 7 is a graph showing the frequency dispersion of the Experiment 1 NFC antenna of Table 1 when it exists in an isolated form, FIG. 8 is a graph showing the frequency dispersion of the Experiment 1 NFC antenna of Table 1 when it is applied to a battery pack, and FIG. 9 is a graph showing the frequency dispersion of the Experiment 2 NFC antenna of Table 1 when it is applied to a battery pack (in FIGS. 7 to 9, the x-axis represents time (min) while the y-axis accounts for frequency (MHz)).

As can be seen in FIGS. 7 and 8, the experiment 1 NFC antenna exhibited a maximum frequency of 28.30 MHz and a minimum frequency of 28.00 MHz with a frequency variation of 0.3 MHz when it exists in an isolate form, but when the experiment 1 NFC antenna was applied to a battery pack, its frequency variation was expanded to 1.0 MHz with frequency detected between 19.4 MHz and 18.4MHz.

In this case, the NFC antenna was determined to be of good quality when in a separate form, but to be of poor quality when applied to a battery pack.

In contrast, when applied to a battery pack, as shown in FIG. 9, the experiment 2 NFC antenna exhibited a maximum frequency of 172 MHz and a minimum frequency of 16.6 MHz with a frequency variation of 0.6 MHz, which was decreased compared to the frequency variation of 1.0 MHz detected in the experiment 1 NFC antenna applied to a battery pack the frequency of which varied between 19.4 MHz and 18.4 MHz as shown in FIG. 8.

Data obtained in Experiments 1 and 2 indicate that when an NFC antenna employing a copper layer-attached ferrite sheet is applied to a battery pack, the copper layer functions to regulate the factors influential in frequency variation, including loose attachment between the adhesive tape and the battery pack, and thus to reduce the frequency variation.

FIG. 10 summarizes measurements of samples prepared in Experiments 1 and 2 of Table 1 for NFC antenna performance.

As is understood from the data of FIG. 10, the NEC antenna employing the copper heat-dissipating layer/ferrite sheet composite of the present invention is substantially equivalent in terms of card mode and reader mode to the NFC antenna employing the ferrite sheet free of the copper heat-dissipating layer.

Although its performance was slightly lower than that of the NEC antenna employing the ferrite sheet alone (ferrite only), the NFC antenna employing the ferrite sheet/copper heat-dissipating layer composite (Cu, sub) was observed to meet the criteria for NEC antenna performance.

NFC antenna performance data given in FIG. 10 were measured with center values for respective conditions, and all were found to pass. For the NFC antenna employing the ferrite sheet only (ferrite only), a broad range of frequency dispersion was detected, and some data (on frequency boundaries) did not meet the criteria.

As is apparent from the experiment result, the electromagnetic wave shielding sheet for an antenna manufactured by forming a copper layer on a ferrite sheet can effectively dissipate heat and reduce frequency variation while minimizing the thickness.

Further, when applied to a battery pack, the electromagnetic wave shielding sheet for an antenna in accordance with the present invention did not exhibit loose attachment or peel-off, and reduced the defective rate of the battery pack, although not given as an experiment result.

Meanwhile, the present invention is not limited to the above-described embodiments and may be changed and modified, without departing from the gist of the present invention, and it should be understood that the technical spirit of such changes and modifications also belong to the scope of the accompanying claims.

What is claimed is:

1. An electromagnetic wave shielding sheet for an antenna, comprising:
    a ferrite sheet;
    a heat dissipating layer attached to one side of the ferrite sheet; and
    an adhesive layer between the ferrite sheet and the heat-dissipating layer via which the heat-dissipating layer is attached to the ferrite sheet,
    wherein the adhesive layer comprises an acryl-based adhesive,
    wherein the adhesive contains Ag and Ni powders in an amount of 10~30 volume %, based on a total volume thereof, so that the adhesive can function as a thermal conductor.

2. The electromagnetic wave shielding sheet of claim 1, wherein the heat-dissipating layer is a metal layer.

3. The electromagnetic wave shielding sheet of claim 2, wherein the metal layer is made of at least one selected from among copper, silver, gold, and aluminum.

4. The electromagnetic wave shielding sheet of claim 1, wherein the heat-dissipating layer has a thickness of more than 0 μm, and 10 μm or less.

5. The electromagnetic wave shielding sheet of claim 1, wherein the heat-dissipating layer is formed on a substrate at one side thereof and is attached to the ferrite sheet at an opposite side thereof via an adhesive, the substrate being applied to the antenna.

6. The electromagnetic wave shielding sheet of claim 5, wherein the substrate is a PET film or a PI film.

7. The electromagnetic wave shielding sheet of claim 1, further comprising a Cu—Ti seed layer between the ferrite sheet and the heat-dissipating layer to increase bonding strength between the ferrite sheet and the heat-dissipating layer.

8. A method for manufacturing an electromagnetic wave shielding sheet for an antenna, comprising:
preparing a ferrite sheet; and
bonding a heat-dissipating layer to one side of the ferrite sheet,
wherein the bonding step comprises:
    forming an adhesive on one side of the ferrite sheet; and
    disposing the heat-dissipating layer on the adhesive,
wherein the adhesive comprises an acryl-based adhesive,
wherein the adhesive contains Ag and Ni powders in an amount of 10~30volume %, based on a total volume thereof, so that the adhesive can function as a thermal conductor.

9. The method of claim 8, wherein the bonding step comprises:
depositing a metal on one side of a substrate to form the heat-dissipating layer;
applying the adhesive to the heat-dissipating layer; and
attaching the heat-dissipating layer to the ferrite sheet via the adhesive to form a multilayer structure composed of the ferrite sheet, the adhesive, the heat-dissipating layer and the substrate in sequence.

10. The method of claim 9, wherein the substrate is a PET film or a PI film.

11. The method of claim 8, wherein the heat-dissipating layer is a metal layer.

12. The method of claim 11, wherein the metal layer is made of at least one selected from among copper, silver, gold, and aluminum.

13. The method of claim 8, wherein the heat-dissipating layer is formed by bonding a copper foil to one side of the ferrite sheet via the adhesive.

14. The method of claim 8, wherein the heat-dissipating layer is integrated into the ferrite sheet using a process selected from among vacuum deposition, chemical vapor deposition, and electroplating.

* * * * *